US011626835B2

(12) United States Patent
Yoshida et al.

(10) Patent No.: US 11,626,835 B2
(45) Date of Patent: Apr. 11, 2023

(54) ENERGY HARVESTER

(71) Applicant: ZEON CORPORATION, Tokyo (JP)

(72) Inventors: Masayoshi Yoshida, Tokyo (JP); Kiyoshige Kojima, Tokyo (JP); Takatoshi Matsuo, Tokyo (JP); Midori Yamaai, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 52 days.

(21) Appl. No.: 16/980,844

(22) PCT Filed: Mar. 15, 2019

(86) PCT No.: PCT/JP2019/010902
§ 371 (c)(1),
(2) Date: Sep. 15, 2020

(87) PCT Pub. No.: WO2019/188433
PCT Pub. Date: Oct. 3, 2019

(65) Prior Publication Data
US 2021/0021231 A1 Jan. 21, 2021

(30) Foreign Application Priority Data
Mar. 30, 2018 (JP) .............................. JP2018-069100

(51) Int. Cl.
*H02S 40/34* (2014.01)
*H02J 50/00* (2016.01)

(52) U.S. Cl.
CPC ............ *H02S 40/34* (2014.12); *H02J 50/001* (2020.01)

(58) Field of Classification Search
CPC .......... H02S 40/34; H02S 40/30; H02S 40/32; H02S 40/36; H01L 31/044;
(Continued)

(56) References Cited

U.S. PATENT DOCUMENTS

2008/0302409 A1* 12/2008 Bressler ................. H02S 20/25
136/251
2011/0017281 A1* 1/2011 Funakoshi ........ H01L 31/02021
136/251
(Continued)

FOREIGN PATENT DOCUMENTS

EP 2339646 B1 9/2017
EP 3691114 A1 8/2020
(Continued)

OTHER PUBLICATIONS

Oct. 6, 2020, International Preliminary Report on Patentability issued in the International Patent Application No. PCT/JP2019/010902.
(Continued)

*Primary Examiner* — Daniel P Malley, Jr.
(74) *Attorney, Agent, or Firm* — Kenja IP Law PC

(57) ABSTRACT

An energy harvester, wherein it comprises: a flat plate-like energy harvesting part having a power generation region which generates electric power by utilizing an energy in the external environment and an internal wiring to which the electric power thus generated is supplied; a connector part connectable to an external device; a diode of which anode is electrically connected with the internal wiring; and a flexible wiring sub state on which the diode and a connection part for electrically connecting a cathode of the diode to the connector part are provided, wherein the internal wiring extends from the power generation region to a side edge portion of the energy harvesting part, and at least a portion of the flexible wiring substrate is provided in the side edge portion so as to overlap a portion of the internal wiring.

10 Claims, 13 Drawing Sheets

(58) Field of Classification Search
CPC ........... H01L 31/0443; H01L 31/02016; H01L 31/02021; H01L 31/042; H01L 31/046; H01L 31/0465; H01L 31/05; H01L 31/0504; H01L 31/0508; H01L 31/048
See application file for complete search history.

(56) References Cited

U.S. PATENT DOCUMENTS

| | | | |
|---|---|---|---|
| 2013/0019923 A1* | 1/2013 | Yamashita | H02S 40/34 136/246 |
| 2018/0062011 A1* | 3/2018 | Crist | H01L 31/044 |
| 2020/0220495 A1* | 7/2020 | Bunea | H01L 31/0504 |

FOREIGN PATENT DOCUMENTS

| | | |
|---|---|---|
| EP | 3780385 A1 | 2/2021 |
| JP | H01176957 U | 12/1989 |
| JP | 2003161003 A | 6/2003 |
| JP | 2016096309 A | 5/2016 |
| KR | 100907192 B1 | 7/2009 |

OTHER PUBLICATIONS

Jan. 19, 2022, the Extended European Search Report issued by the European Patent Office in the corresponding European Patent Application No. 19774475.8.

* cited by examiner

ENERGY HARVESTER

TECHNICAL FIELD

The present invention relates to an energy harvester.

BACKGROUND ART

There has been conventionally known an energy harvester which generates electric power by utilizing an energy in the external environment. Examples of the energy harvester include a device generating electric power by utilizing sunlight, a device generating electric power by utilizing vibration, a device generating electric power by utilizing geothermal heat, and the like. The energy harvester can supply electric power thus generated to an external device and the like.

Such an energy harvester as described above is generally provided with a reverse-current blocking diode. A reverse-current blocking diode can prevent a reverse flow of electric current from an external device or the like to the energy harvester. For example, in a solar cell device described in PTL 1, a reverse-current blocking diode is provided in an exposed portion of a wiring substrate where solar cells are disposed.

CITATION LIST

Patent Literature

PTL 1: JP01-176957 U1 (1989)

SUMMARY OF THE INVENTION

Technical Problems

In the solar cell device described in PTL 1, the reverse-current blocking diode and terminals for supplying electric power thus generated to a secondary cell or the like are provided on the wiring substrate where the solar cells are disposed. Further, in the solar cell device described in PTL 1, the solar cells, the reverse-current blocking diode and the aforementioned terminals are provided in this order in the direction from the bottom toward the top of the substantially rectangular wiring substrate, resulting in a significant increase in size of the solar cell device.

In view of this, an object of the present disclosure is to solve the prior art problems described above and provide an energy harvester compact in size.

The present disclosure aims at advantageously solving the aforementioned problems. An energy harvester of the present disclosure comprises: a flat plate-like energy harvesting part having a power generation region which generates electric power by utilizing an energy in the external environment and an internal wiring to which the electric power thus generated is supplied; a connector part connectable to an external device; a diode of which anode is electrically connected with the internal wiring; and a flexible wiring substrate on which the diode and a connection part for electrically connecting a cathode of the diode to the connector part are provided, wherein the internal wiring extends from the power generation region to a side edge portion of the energy harvesting part, and at least a portion of the flexible wiring substrate is provided in the side edge portion so as to overlap a portion of the internal wiring.

The diode and the connection part are provided on the flexible wiring substrate in the present disclosure, whereby a degree of freedom in deciding locations where the diode and the connection part are to be provided increases. An increase in degree of freedom in locations where the diode and the connection part are to be provided allows an energy harvester to be made compact in size.

In the energy harvester of the present disclosure, it is preferable that peripheries of the diode (30) are coated with a sealing material. It is possible to prevent a short circuit between the anode and the cathode due to intrusion of water droplets or the like from occurring by coating peripheries of the diode with a sealing material.

In the energy harvester of the present disclosure, it is preferable that a conductor member exposed from the flexible wiring substrate in the vicinity of the diode is coated with a sealing material. It is possible to prevent intrusion of water droplet or the like into the conductor member by coating the conductor member exposed from the flexible wiring substrate in the vicinity of the diode with a sealing material. Preventing intrusion of water droplet or the like into the conductor member in the vicinity of the diode ensures prevention of a short circuit due to intrusion of water droplet or the like between the anode and the cathode of the diode.

In the energy harvester of the present disclosure, it is preferable that the energy harvester further comprises a housing for accommodating the diode and the connection part and clamping the side edge portion of the energy harvesting part. It is possible to protect the diode and a portion of the connector part from an impact applied from the exterior by such an arrangement as described above.

In the energy harvester of the present disclosure, it is preferable that the flexible wiring substrate is bent to extend from one surface of the side edge portion to the other surface thereof and that the diode is located on the one surface side of the side edge portion and the connection part is located on the other surface side of the side edge portion. It is possible to decrease a length of the energy harvester by such an arrangement as described above than a case where the diode and the connection part are disposed on the same plain along the same axis thereon, for example, thereby successfully making the energy harvester compact in size.

In the energy harvester of the present disclosure, it is preferable that the diode and the connection part are disposed on a plain vertical to the flat plate-like energy harvesting part. It is possible to decrease a width of the energy harvester by such an arrangement as described above, thereby successfully making the energy harvester compact in size.

In the energy harvester of the present disclosure, it is preferable that the flexible wiring substrate is disposed on the one surface of the side edge portion, the diode and the connection part(s) are located on the one surface side of the side edge portion, and the connection part/parts is/are positioned between the diode and the power generation region in a direction in which the connector part is attached to/detached from the exterior device. It is possible to decrease a length of the energy harvester by such an arrangement as described above than a case where the diode and the connection part are disposed on the same plain along the same axis thereon, for example, thereby successfully making the energy harvester compact in size.

In the energy harvester of the present disclosure, it is preferable that the diode and the connection part are juxtaposed with each other to be substantially in parallel to a side edge of the energy harvesting part. It is possible by such an arrangement as described above to further decrease a length of wiring which electrically connects the diode and the connection part.

In the energy harvester of the present disclosure, it is preferable that the energy harvesting part has an opening portion where the internal wiring is exposed and that the flexible wiring substrate is provided in the opening portion. It is possible by such an arrangement as described above to attach the flexible wiring substrate to the internal wiring firmly with no clearance therebetween. Attaching the flexible wiring substrate to the internal wiring firmly with no clearance therebetween enhances reliability of connection between the flexible wiring substrate and the internal wiring, thereby successfully making the energy harvester compact in size.

In the energy harvester of the present disclosure, it is preferable that a projecting portion projecting from the power generation region includes the side edge portion of the energy harvesting part.

In the energy harvester of the present disclosure, it is preferable that the diode and the connection part are located in the projecting portion.

According to the present disclosure, it is possible to provide an energy harvester compact in size.

DETAILED DESCRIPTION

Hereinafter, embodiments according to the present disclosure will be described with reference to the drawings. The same reference number will be assigned to the same structural portion in the respective drawings hereinafter. The "X" axis direction represents the longitudinal direction, the "Y" axis direction represents the widthwise direction, and the "Z" axis direction represents the thickness direction, of an energy harvester in the respective drawings. The attaching/detaching direction represents the positive/negative direction along the X axis shown in FIG. 1 and other drawings in the present disclosure.

First Embodiment

An energy harvester 1 according to a first embodiment of the present disclosure will be described with reference to FIG. 1 to FIG. 7 hereinafter.

Figure 1:
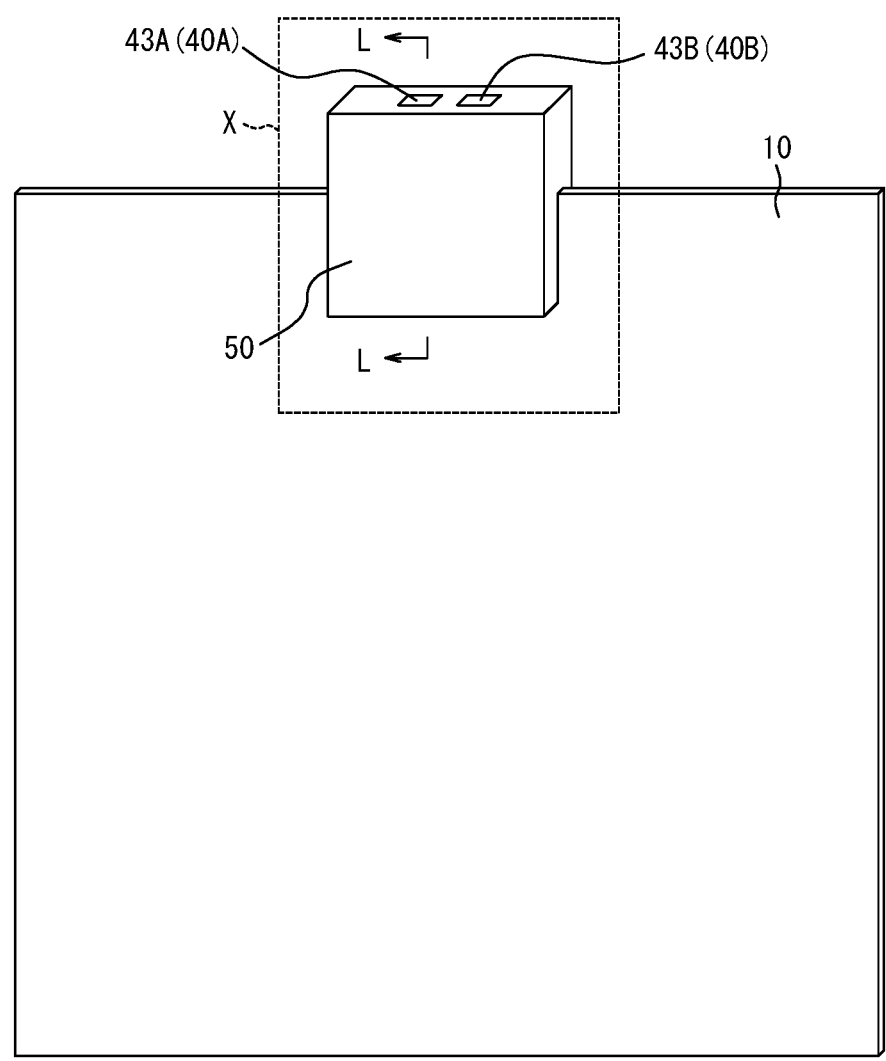
FIG. 1 is a drawing showing a schematic structure of an energy harvester according to a first embodiment of the present disclosure.

The energy harvester 1 shown in FIG. 1 generates electric power by utilizing an energy in the external environment. Examples of an energy in the external environment include sunlight, vibration, geothermal heat, and the like. The energy harvester 1 can supply electric power thus generated to an external device. A female connector 2 shown in FIG. 1 is an example of the external device. The female connector 2 has a positive electrode terminal 2A and a negative electrode terminal 2B.

Figure 4:
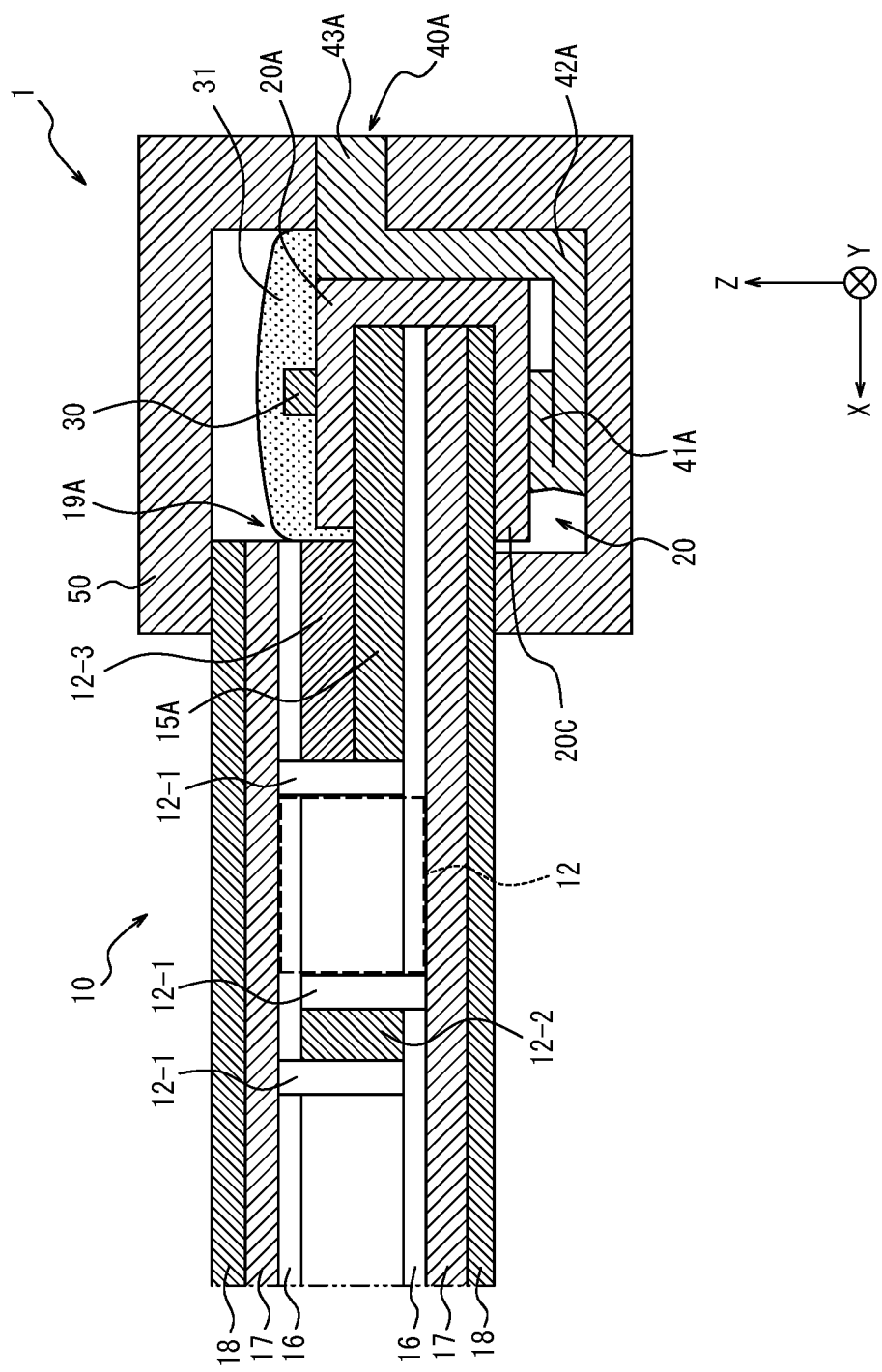
FIG. 4 is a sectional view of the energy harvester of FIG. 1, cut along the L-L line shown in FIG. 1.

As shown in FIG. 1 and FIG. 4, the energy harvester 1 has an energy harvesting part 10, a flexible wiring substrate 20, a diode 30, a sealing material 31, and a pair of connector parts 40A, 40B. The energy harvester 1 may further have a housing 50 according to necessity.

Figure 2:
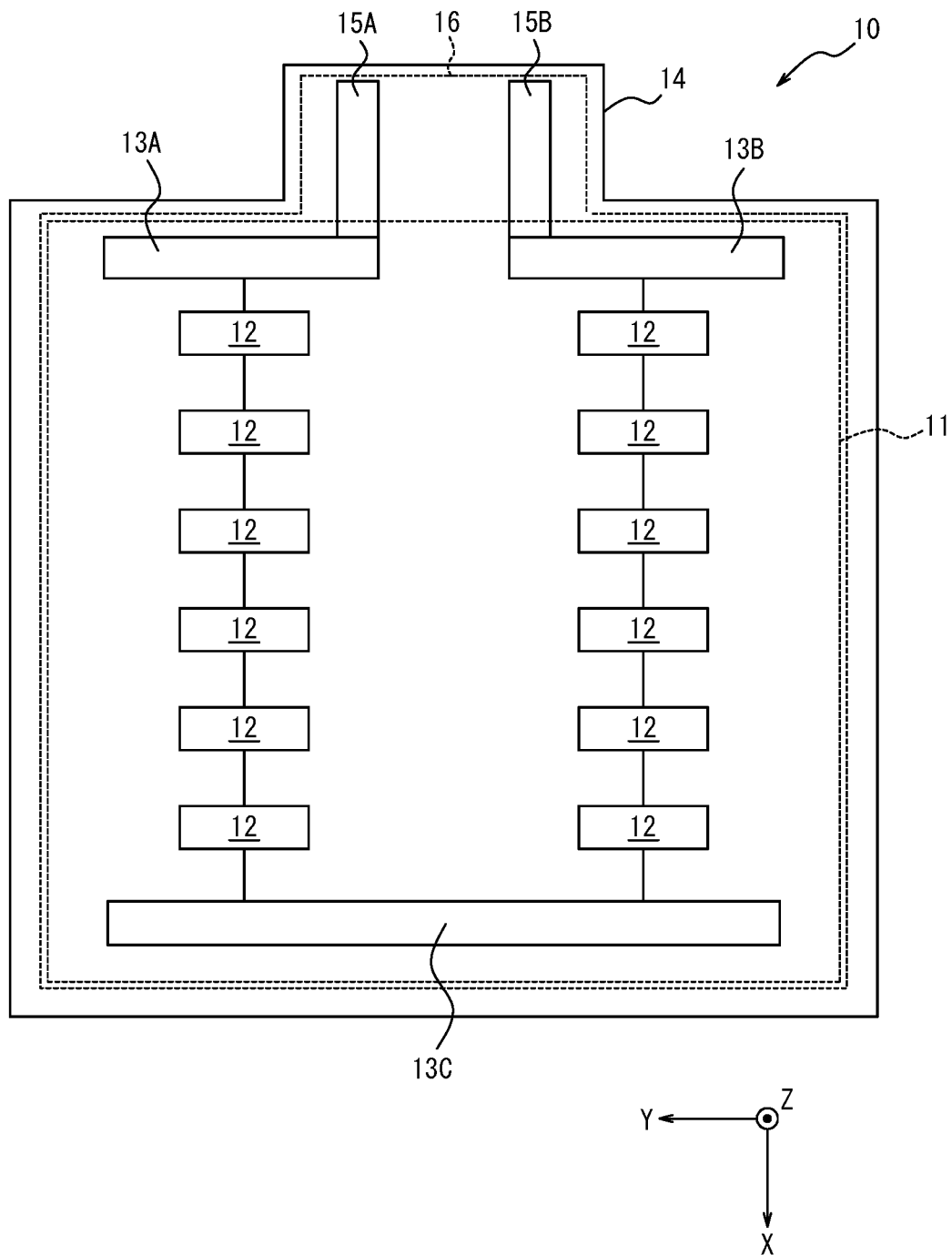
FIG. 2 is a drawing showing a schematic structure of an energy harvesting part shown in FIG. 1.
Figure 6:
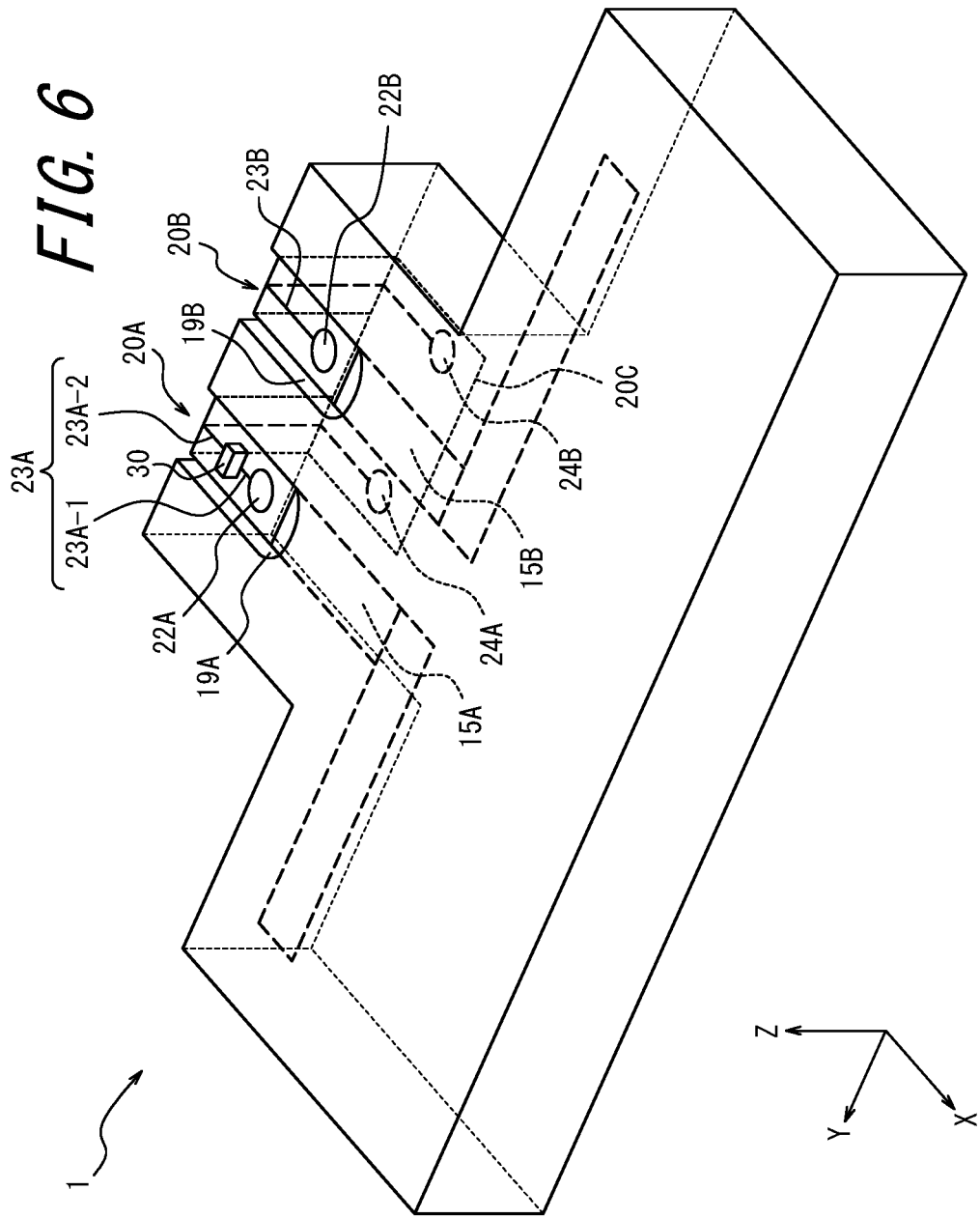
FIG. 6 is an enlarged view of a portion X encircled by dotted line, of the structure shown in FIG. 1, in a state where the housing has been removed.

The energy harvesting part 10 has a flat plate-like appearance, as shown in FIG. 1. The energy harvesting part 10 has a power generation region 11, a projecting portion 14, each internal wiring 15A, 15B, an electrode substrate 16, a sealing member 17, and a casing member 18, as shown in FIG. 2 and FIG. 4. The energy harvesting part 10 may further have an opening portion 19A and an opening portion 19B, as shown in FIG. 6.

The energy harvesting part 10 has a side edge portion. A "side edge portion of the energy harvesting part" represents a portion defined between a side located on the most negative direction-side along the X axis, of the energy harvesting part 10, and a position distanced therefrom by a predetermined distance in the positive direction along the X axis. The predetermined distance may be set in an appropriate manner according to the configuration, the structure and the like of the energy harvester 1 of the present disclosure. The projecting portion 14 includes the side edge portion of the energy harvesting part 10 according to the first embodiment. Another example of the side edge portion will be described later with reference to FIG. 10.

The power generation region 11 shown in FIG. 2 generates electric power by utilizing an energy in the external environment. The power generation region 11 has twelve solar cells 12 and current-collecting electrodes 13A, 13B, 13C, as shown in FIG. 2. In a case where the solar cells 12 are dye-sensitized solar cells, the power generation region 11 may further have partitions 12-1 for defining the respective solar cells 12, cell-connecting portions 12-2 for connecting the respective adjacent solar cells 12, and a filler member 12-3, as shown in FIG. 4. The power generation region 11 shown in FIG. 2 has twelve solar cells 12. However, the number of the solar cells 12 belonging to the power generation region 11 is not limited to twelve but may be eleven or less or thirteen or more.

The structure of the power generation region 11 is not limited to the structure thereof shown in FIG. 2. For example, the power generation region 11 may have a structure including piezoelectric elements for converting vibrations into electric power in a case where the power generation region 11 utilizes vibration as an energy in the external environment. Alternatively, the power generation region 11 may have a structure including heat exchange elements for converting heat into electric power in a case where the power generation region 11 utilizes geothermal heat as an energy in the external environment.

The solar cells 12 convert light energy of incident light such as sunlight, indoor light or the like into electric energy. The solar cells 12 are, for example, dye-sensitized solar cells. Dye-sensitized solar cells generate electric power by causing dyes adsorbed on porous titania thereof to absorb light and generate electrons.

The solar cells 12 are provided on the electrode substrate belonging to the power generation region 11. A plurality of the solar cells 12 are connected in series. For example, two series-connection units, each of which includes six solar cells 12 connected in series, are formed, as shown in FIG. 2. In the two series-connection units, one series-connection unit is disposed on the positive direction side along the Y axis and connected to the current-collecting electrode 13A and the other series-connection unit is disposed on the negative direction side along the Y axis and connected to the current-collecting electrode 13B. Further, the two series-connection units are connected in series by way of the current-collecting electrode 13C.

The current-collecting electrodes 13A-13C may be formed on the electrode substrate 16 by electrically conductive paste. The electrically conductive paste may be, for example, a mixture of electrically conductive particles and a resin. Examples of an electrically conductive substance include copper, silver, carbon, and the like. Alternatively, the current-collecting electrodes 13A-13C may be formed by pasting metal foils to the electrode substrate 16 by using an electrically conductive adhesive.

The current-collecting electrodes 13A-13C are connected to electrodes of the solar cells 12 which constitute end portions, in electrical terms, of the solar cell 12 rows. For example, a portion of the current-collecting electrode 13A is electrically connected to the positive electrode of the solar cell 12 of the series-connection unit disposed on the positive direction side of the Y axis, as shown in FIG. 2. Further, a portion of the current-collecting electrode 13A (other than the portion electrically connected to the positive electrode of the solar cell 12) is electrically connected to the internal wiring 15A. For example, a portion of the current-collecting electrode 13B is electrically connected to the negative electrode of the solar cell 12 of the series-connection unit disposed on the negative direction side of the Y axis, as shown in FIG. 2. Further, a portion of the current-collecting electrode 13B (other than the portion electrically connected to the negative electrode of the solar cell 12) is electrically connected to the internal wiring 15B. For example, a portion of the current-collecting electrode 13C is electrically connected to the negative electrode of the solar cell 12 of the series-connection unit disposed on the positive direction side of the Y axis, as shown in FIG. 2. Further, a portion of the current-collecting electrode 13C (other than the portion electrically connected to the negative electrode of the solar cell 12) is electrically connected to the positive electrode of the solar cell 12 disposed on the negative direction side of the Y axis.

The projection portion 14 projects from the power generation region 11. The projection portion 14 and the power generation region 11 may be formed to be integral with each other. The thickness of the projecting portion 14 (the thickness thereof at the portions other than the portions where the opening portions 19A, 19B are formed) may be identical with the thickness of the power generation region 11, as shown in FIG. 6.

The internal wiring 15A may be formed on a surface of the electrode substrate 16 such that the internal wiring 15A is integral with the current-collecting electrode 13A. Similarly, the internal wiring 15B may be formed on a surface of the electrode substrate 16 such that the internal wiring 15B is integral with the current-collecting electrode 13B. In a case where the internal wirings 15A, 15B are formed to be integral with the current-collecting electrodes 13A, 13B, respectively, the internal wirings 15A, 15B may be formed of the same material as the current-collecting electrodes 13A, 13B, for example, electrically conductive paste. It is preferable to form the internal wirings 15A, 15B by copper paste in particular because then reliability is ensured even when the internal wirings 15A, 15B are exposed from the opening portions 19A, 19B, respectively. Alternatively, the internal wirings 15A, 15B may be formed by metal foil having thickness not exceeding 300 μm. The internal wirings 15A, 15B may be tapes of copper foil. The internal wiring 15A extends, on the positive direction side of the Y axis, from the power generation region 11 to the side edge portion included by the projected portion 14, as shown in FIG. 2. The internal wiring 15B extends, on the negative direction side of the Y axis, from the power generation region 11 to the side edge portion included by the projected portion 14.

In a case where the internal wirings 15A, 15B are formed on the electrode substrate 16, the electrode substrate 16 itself may be extended so that the internal wirings 15A, 15B are formed on the extended portion of the electrode substrate 16. This structure as an example will be described hereinafter, assuming that the solar cells 12 are dye-sensitized solar cells. Each of the dye-sensitized solar cells has a structure in which i) an electrolyte layer is interposed between a photoelectrode and a counter electrode facing each other and ii) the surroundings of the cell are sealed by the partitions 12-1 shown in FIG. 4. The respective adjacent solar cells 12 are connected in series by the respective cell connecting portions 12-2 shown in FIG. 4. The two electrode substrates 16 are provided such that they face each other with the electrode surfaces thereof oriented on the inner side, respectively, as shown in FIG. 4. One of the two facing electrode substrates 16 is appropriately processed by laser or the like so that portions thereof surrounding the solar cells 12, which portions need to be insulated, are insulated, whereby twelve photoelectrodes of the solar cells 12 having semiconductor layers are formed therein. Similarly, twelve counter electrodes of the solar cells 12 having catalyst layers are formed in the other electrode substrate 16. The current-collecting electrodes 13A-13C and the internal wirings 15A, 15B which are formed to be integral with the current-collecting electrodes 13A, 13B are formed on one of the electrode substrates 16. Further, the electrode substrate 16 itself having the wirings formed thereon extends from the power generation region 11 to the side edge portion of the energy harvesting part 10. A gap between the extended portions of the electrode substrates 16, 16 facing each other is filled by the filler member 12-3. The filler member 12-3 and the partition 12-1 may be formed to be integral with each other. The filler member 12-3 may be formed by the same material as the sealing member 17 described below. It is possible to prevent air, moisture and the like in the exterior from entering the solar cells 12, by filling the gap between the extended portions of the electrode substrates 16, 16 by the filler member 12-3.

A voltage generated in the power generation region 11 is applied to the internal wiring 15A, 15B. For example, the internal wiring 15A is electrically connected to the current-collecting electrode 13A, as shown in FIG. 2. A voltage on the positive electrode side of the power generation region 11 is applied to the internal wiring 15A. For example, the internal wiring 15B is electrically connected to the current-collecting electrode 13B, as shown in FIG. 2. A voltage on the negative electrode side of the power generation region 11 is applied to the internal wiring 15B.

The sealing member 17 shown in FIG. 4 seals the power generation region 11. The sealing member 17 may be formed of a cured resin composition for sealing. Examples of the resin composition for sealing include a photocurable resin composition, a thermosetting resin composition, a thermoplastic resin composition, and the like. It is possible to prevent air, moisture and the like in the exterior from entering the solar cells 12 by sealing the power generation region 11 by the sealing member 17.

A material having a functionality suitable for an application, a material as a mixture of members capable of expressing the functionality, or a member having a surface on which a functional film for expressing the functionality has been formed can be used for the casing member 18 shown in FIG. 4. Specific examples of the functionality include a barrier function of suppressing permeation of water vapor or gas, a ray-cutting function of cutting a specific wavelength such as ultraviolet, an antifouling function of preventing a surface from being stained, a hard coating function of preventing a surface from being scratched, a color coating function of changing colors of a panel main body, and the like. The casing member 18 may be constituted of either a single layer provided with a plurality of functions or plural laminated layers each of which is provided with a function.

The opening portion 19A is formed on the positive direction side, along the Y axis, of the projection portion 14, as shown in FIG. 6. A portion of the flexible wiring substrate 20A is provided in the opening portion 19A. The opening portion 19B is formed on the negative direction side, along the Y axis, of the projection portion 14. A portion of the flexible wiring substrate 20B is provided in the opening portion 19B.

The opening portion 19A and the opening portion 19B may be formed in the projection portion 14 by laser after sealing the energy harvesting part 10 by the sealing member 17 and mounting the casing member 18 thereon. It is possible to provide the flexible wiring substrate 20 in the projection portion 14 after mounting the casing member 18 on the energy harvesting part 10, by forming the opening portions 19A, 19B as described above. Alternatively, the opening portions 19A, 19B may be formed after formation of the energy harvesting part 10 by using the electrode substrate 16 already having the casing member 18 laminated on an outer surface thereof. The process of separately mounting the casing member 18 on the energy harvesting part 10 can be omitted by using the electrode substrate 16 already having the casing member 18 laminated thereon. The opening portions 19A, 19B may be formed such that they are distanced from the power generation region 11 to some degree. It is possible by such a structure as described above to separate the power generation region 11 from the opening portions 19A, 19B by some distance, thereby successfully suppressing entry of moisture from the external environment into the power generation region 11 and thus deterioration of power generation capacity of the power generation region 11 due to the entry of moisture thereto.

Figure 7:
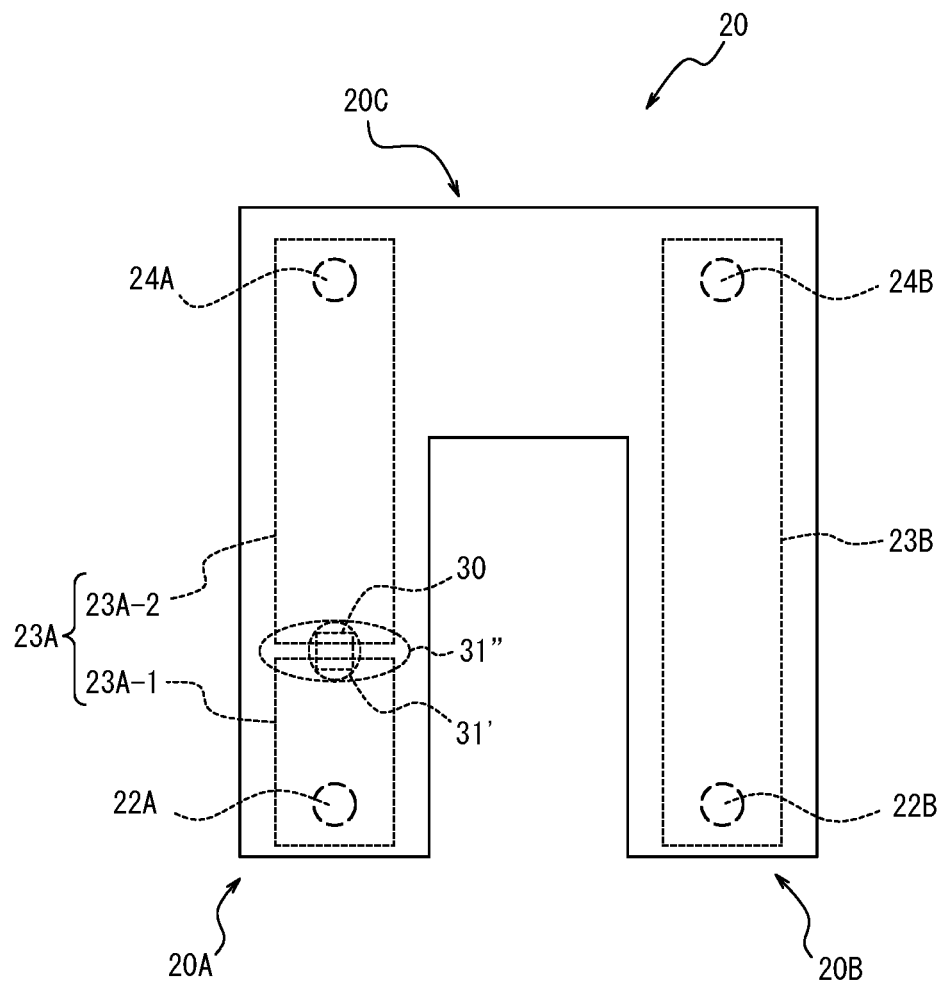
FIG. 7 is a drawing showing schematic structures of respective flexible wiring substrates shown in FIG. 6.

The flexible wiring substrate 20 shown in FIG. 7 has flexibility. The flexible wiring substrate 20 may have a flat plate-like configuration. The flexible wiring substrate 20 may be either FPC (flexible printed circuits) having a single-layer structure or FPC having a multilayer structure.

The flexible wiring substrate 20 has a flexible wiring substrate 20A, a flexible wiring substrate 20B, and a flexible wiring substrate 20C, as shown in FIG. 7. The flexible wiring substrate 20 shown in FIG. 7 has a U-shaped structure. The structure of the flexible wiring substrate 20 of the present disclosure, however, is not limited to a U-shaped structure. For example, the flexible wiring substrate 20 may include separate flexible wiring substrates independent of each other, as described below with reference to FIG. 9.

As shown in FIG. 6, a portion of the flexible wiring substrate 20A and a portion of the flexible wiring substrate 20B are disposed on one (surface) plane positioned on the positive direction side along the Z axis, of the two (surface) planes included in the projection portion 14 and substantially in parallel to the XY plane. The flexible wiring substrate 20A is disposed in a portion on the positive direction side, along the Y axis, of the projection portion 14. The flexible wiring substrate 20B is disposed in a portion on the negative direction side, along the Y axis, of the projection portion 14.

As shown in FIG. 4, a portion of the flexible wiring substrate 20A may be provided in the opening portion 19A. Specifically, a portion of the flexible wiring substrate 20A may be provided on the internal wiring 15A exposed from the opening portion 19A. It is possible by the structure to employ a process of providing the flexible wiring substrate 20 in the projection portion 14 after mounting the casing member 18 on the energy harvesting part 10, as described above. Further, it is also possible by the structure to achieve good adhesion of the flexible wiring substrate 20A and the internal wiring 15A without clearance therebetween. Good adhesion of the flexible wiring substrate 20A and the internal wiring 15A without clearance therebetween enhances reliability in wiring connection between the flexible wiring substrate 20A and the internal wiring 15A. Moreover, the energy harvester 1 can be further made compact in size by the aforementioned structure.

As shown in FIG. 6, a portion of the flexible wiring substrate 20B may be provided in the opening portion 19B in a manner similar to the flexible wiring substrate 20A. Specifically, a portion of the flexible wiring substrate 20B may be provided on the internal wiring 15B exposed from the opening portion 19B. The flexible wiring substrate 20B can cause by the structure an effect similar to that of the flexible wiring substrate 20A described above.

As shown in FIG. 6, the flexible wiring substrate 20C is disposed on the other (surface) plane positioned on the negative direction side along the Z axis, of the two (surface) planes included in the projection portion 14 and substantially in parallel to the XY plane.

The flexible wiring substrate 20 may be bent along an outer surface of the projection portion 14. For example, the flexible wiring substrate 20A may be bent along an outer surface of the projection portion 14 on the positive direction side of the Y axis, as shown in FIG. 6. The flexible wiring substrate 20B may be bent along an outer surface of the projection portion 14 on the negative direction side of the Y axis. The flexible wiring substrates 20A, 20B may be bent at a substantially right angle, as shown in FIG. 6. Alternatively, the flexible wiring substrates 20A, 20B may be curved in a substantially U-shape, depending on a sectional configuration of the projection portion 14, for example.

The flexible wiring substrate 20 thus bent extends from one surface of the side edge portion of the projection portion 14 to the other surface thereof. For example, the flexible wiring substrate 20A is thus bent on the positive direction side of the Y axis, as shown in FIG. 6, whereby the flexible wiring substrate 20 extends from one surface, positioned on the positive direction side of the Z axis, of the projection portion 14 to the other surface, positioned on the negative direction side of the Z axis, of the projection portion 14. Further, the flexible wiring substrate 20B is thus bent on the negative direction side of the Y axis, whereby the flexible wiring substrate 20 extends from one surface, positioned on the positive direction side of the Z axis, of the projection portion 14 to the other surface, positioned on the negative direction side of the Z axis, of the projection portion 14.

Figure 5:
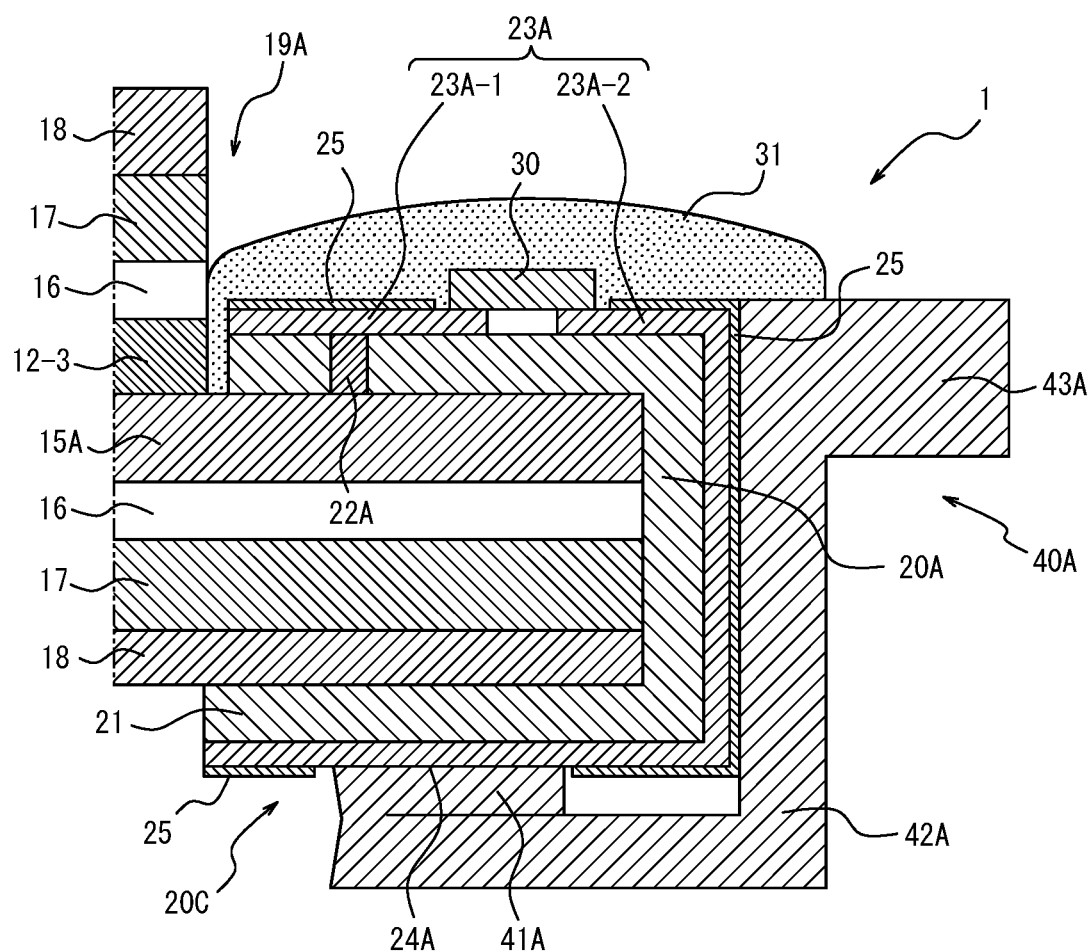
FIG. 5 is an enlarged view of the structure shown in FIG. 4, in a state where a housing has been removed.

The flexible wiring substrate 20 has an insulating layer 21, connecting members 22A, 22B, wiring layers 23A, 23B, connection parts 24A, 24B, and a protection layer 25, as shown in FIG. 5 and FIG. 7. The positions of the connecting members 22A, 22B, the wiring layers 23A, 23B and the connection parts 24A, 24B disposed in the flexible wiring substrate 20 are indicated by broken lines, respectively, in FIG. 7.

The insulating layer 21 is directly provided on an outer surface of the projection portion 14, as shown in FIG. 5. The insulating layer 21 may be formed of a resin such as polyimide.

The connecting member 22A is formed in the flexible wiring substrate 20A, as shown in FIG. 7. The connecting member 22B is formed in the flexible wiring substrate 20B. The connecting members 22A, 22B may be formed by providing through holes in the insulating layer 21 of the flexible wiring substrate 20A and the insulating layer 21 of the flexible wiring substrate 20B, respectively, and filling the through holes by a conductive member such as a conductive adhesive.

The connecting member 22A electrically connects the internal wiring 15A and the wiring layer 23A (wiring layer 23A-1), as shown in FIG. 5. The connecting member 22B electrically connects the internal wiring 15B and the wiring layer 23B.

As shown in FIG. 6, the wiring layer 23A is positioned on the positive direction side of the Y axis in the flexible wiring substrate 20. The wiring layer 23B is positioned on the negative direction side of the Y axis in the flexible wiring substrate 20. The wiring layers 23A, 23B may be formed by metal foil having thickness not exceeding 300 μm. The wiring layers 23A, 23B may be tapes of copper foil.

One end portion of the wiring layer 23A is electrically connected to the internal wiring 15A by way of the connecting member 22A, as shown in FIG. 5. The other end portion of the wiring layer 23A is electrically connected to a spring 41A of the connector part 40A by way of the connection part 24A. For example, as shown in FIG. 5, the wiring layer 23A may include a wiring layer 23A-1 as the one end portion of the wiring layer 23A and a wiring layer 23A-2 as the other end portion of the wiring layer 23A.

One end portion of the wiring layer 23B is electrically connected to the internal wiring 15B by way of the connecting member 22B in a manner similar to the wiring layer 23A. The other end portion of the wiring layer 23B is electrically connected to a spring 41B of the connector part 40B by way of the connection part 24B.

The wiring layer 23A is electrically connected to the diode 30, as shown in FIG. 5. For example, the wiring layer 23A-1 is electrically connected to the anode of the diode 30. The wiring layer 23A-2 is electrically connected to the cathode of the diode 30.

The connection part 24A may be a portion of the wiring layer 23A-2 as the other end of the wiring layer 23A. The connection part 24A may be formed by exposing a portion of the wiring layer 23A-2 by removing a corresponding portion of the protection layer 25 in this case. The connection part 24B may be a portion of the other end of the wiring layer 23B. The connection part 24B may be formed by exposing a portion of the other end of the wiring layer 23B by removing a corresponding portion of the protection layer 25 in this case.

The connection parts 24A, 24B are positioned on the other surface side of the projection portion 14, for example, on the side of a surface on the negative direction side along the Z axis of the projection portion 14, respectively, as shown in FIG. 6. The connection parts 24A, 24B may have any appropriate configurations.

The connection part 24A electrically connects the cathode of the diode 30 to the spring 41A of the connector part 40A, as shown in FIG. 5. The connection part 24B electrically connects the internal wiring 15B to the spring 41B of the connector part 40B by way of the wiring layer 23B. The connection parts 24A, 24B are connected to the springs 41A, 41B, respectively, either directly or by way of solder and/or a conductive member, wherein either manner, i.e. directly or by way of a conductive member like solder, is acceptable.

The protection layer 25 shown in FIG. 5 is formed as an upper layer of the flexible wiring substrate 20. The protection layer 25 may be formed by solder resist.

The diode 30 is provided on the flexible wiring substrate 20A, as shown in FIG. 5. The diode 30 is positioned on the one surface side of the projection portion 14, for example, on the side of a surface on the positive direction side along the Z axis of the projection portion 14, as shown in FIG. 6.

The anode of the diode 30 is electrically connected to the internal wiring 15A by way of the wiring layer 23A-1, as shown in FIG. 5. The cathode of the diode 30 is electrically connected to the spring 41A of the connector part 40A by way of the wiring layer 23A-2, as shown in FIG. 5. It is possible by the arrangement to prevent a reverse flow of electric current from an external device or the like to the power generation region 11 by way of the connector part 40A and the internal wiring 15A.

The sealing material 31 shown in FIG. 4 covers the surroundings of the diode 30. A position at which the diode 30 is to be disposed is indicated by broken line in FIG. 7. Further, one example of a position at which the sealing material 31 is to be disposed is shown by broken line 31' and another example of a position at which the sealing material 31 is to be disposed is shown by broken line 31" in FIG. 7. The sealing material 31 may be disposed so as to coat the peripheries of the diode 30, as shown by the broken line 31' in FIG. 7. The same material as that of the sealing member 17 can be used for the sealing material 31. It is possible to prevent a short circuit between the anode and the cathode of the diode 30 due to intrusion of water droplets or the like from occurring by coating peripheries of the diode 30 with a sealing material 31.

Further, the sealing material 31 may cover a conductive member which is exposed, at a portion thereof surrounding (in the vicinity of) the diode 30, from the flexible wiring substrate 20A, as shown in FIG. 5. The conductive member may include, without limitation thereto, the wiring layers 23A-1, 23A-2 exposed from the protection layer 25. The sealing material 31 may be disposed to cover the wiring layers 23A-1, 23A-2, as indicated by the broken line 31" in FIG. 7. It is possible to prevent intrusion of water droplets or the like into the conductive member by coating the conductive member exposed from the flexible wiring substrate 20A in the surroundings (the vicinity) of the diode 30, with a sealing material 31. It is more reliably prevent a short circuit between the anode and the cathode of the diode 30 due to intrusion of water droplets or the like from occurring by preventing intrusion of water droplets or the like into the conducive member in the surroundings (the vicinity) of the diode 30.

Yet further, the sealing material 31 may cover the internal wiring 15A exposed from the opening portion 19A, as shown in FIG. 5. It is possible to suppress deterioration of the internal wiring 15A due to exposure to the ambient atmosphere, by coating the internal wiring 15A exposed from the opening portion 19 with the sealing material 31.

Figure 3:
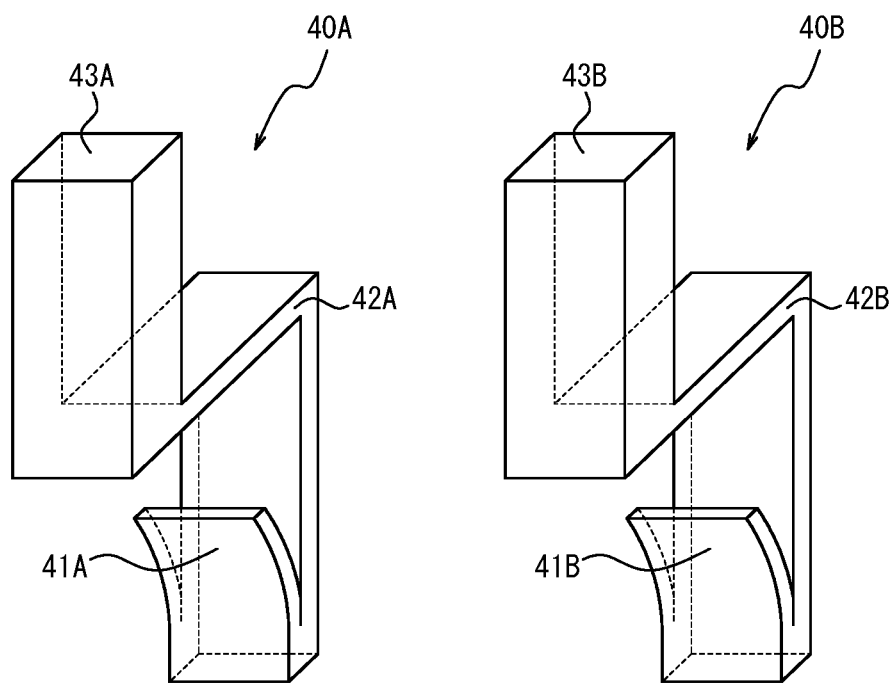
FIG. 3 is a drawing showing a schematic structure of each connector part shown in FIG. 1.

The connector parts 40A, 40B shown in FIG. 3 have electric conductivity. As shown in FIG. 3, the connector part 40A has the spring 41A, a main body portion 42A, and a terminal portion 43A. The connector part 40B has the spring 41B, a main body portion 42B, and a terminal portion 43B. The spring 41A, the main body portion 42A, and the terminal portion 43A may be formed to be integral with each other by a conductive material. Similarly, the spring 41B, the main body portion 42B, and the terminal portion 43B may be formed to be integral with each other by a conductive material. Examples of the conductive material include: a metal material selected from the group consisting of copper, aluminum, nickel and iron; an alloy material containing these metal materials; and the like. It is possible to simplify a process of manufacturing the connector part 40A by forming the spring 41A, the main body portion 42A and the terminal portion 43A to be integral with each other. A process of manufacturing the connector part 40B can also be simplified in the same manner as the connector part 40A.

The springs 41A, 41B may be plate (leaf) springs, as shown in FIG. 3. However, the springs 41A, 41B are not restricted to plate (leaf) springs. The springs 41A, 41B may be springs of other types, as long as they are elastic, and examples thereof include a coil spring and the like.

The spring 41A shown in FIG. 3 is electrically connected to the wiring layer 23A-2 as the other end portion of the wiring layer 23A by way of the connection part 24A, as shown in FIG. 5. Similarly, the spring 41B shown in FIG. 3 is electrically connected to the other end portion of the wiring layer 23B by way of the connection part 24B shown in FIG. 7. The spring 41A is pushed against the connection part 24A by the inner wall of the housing 50, as shown in FIG. 4. Similarly, the spring 41B is pushed against the connection part 24B by the inner wall of the housing 50. It is possible to enhance the connection strength between the spring 41A and the connection part 24A and the connection strength between the spring 41B and the connection part 24B by the arrangement.

The main body portion 42A of the connector part 40A is disposed along an outer surface of the flexible wiring substrate 20A, as shown in FIG. 5. The main body portion 42B of the connector part 40B is disposed along an outer surface of the flexible wiring substrate 20B, as shown in FIG. 5. The main body portion 42A may faithfully follow the outer shape of the flexible wiring substrate 20A in a bent state. For example, in a case where the flexible wiring substrate 20A is bent at a substantially right angle, as shown in FIG. 5, the main body portion 42A may have a configuration bent at a substantially right angle. Similarly, the main body portion 42B may faithfully follow the outer shape of the flexible wiring substrate 20B in a bent state.

The terminal portion 43A and the terminal portion 43B are connectable to an external device. For example, the front end of the terminal portion 43A and the front end of the terminal portion 43B are exposed from the housing 50, respectively, as shown in FIG. 1. The front end of the terminal portion 43A exposed from the housing 50 is electrically connectable to the positive electrode terminal 2A of the female connector 2 shown in FIG. 1. The front end of the terminal portion 43B exposed from the housing 50 is electrically connectable to the negative electrode terminal 2B of the female connector 2 shown in FIG. 1.

The housing 50 shown in FIG. 4 has electrical insulation properties. The housing 50 may be constituted of a resin material or the like. The housing 50 shown in FIG. 4 clamps the projection portion 14 shown in FIG. 2. Further, the housing 50 accommodates the diode 30 and the connector parts 40A, 40B. The housing 50 can protect the diode 30 and the connector parts 40A, 40B from an impact applied from the exterior by such an arrangement as described above.

The housing 50 is attached to/detached from the exterior device such as the female connector 2 shown in FIG. 1. The housing 50 may have a configuration faithfully following the configuration of the exterior device. For example, in a case where the female connector 2 shown in FIG. 1 has a projection formed on an outer surface thereof, a groove portion engageable with the projection may be provided in an outer surface of the housing 50.

The diode 30 and the connection parts 24A, 24B are provided in the flexible wiring substrate 20 in the present disclosure, as described above. It is possible in the present disclosure to increase a degree of freedom in positioning the diode 30 and the connection parts 24A, 24B by providing the diode 30 and the connection parts 24A, 24B in the flexible wiring substrate 20. It is possible in the present disclosure to make the energy harvester 1 compact in size by thus increasing a degree of freedom in positioning the diode 30 and the connection parts 24A, 24B.

In respect of the aforementioned positions at which the diode 30 and the connection parts 24A, 24B are to be disposed, respectively, the diode 30 is positioned on one surface side of the projection portion 14 and the connection parts 24A, 24B are positioned on the other surface side of the projection portion 14 in the energy harvester 1 according to the first embodiment. For example, the diode 30 is disposed on one plane positioned on the positive direction side along the Z axis, of the projection portion 14, and the connection parts 24A, 24B are disposed on another plane positioned on the negative direction side along the Z axis, of the projection portion 14, as shown in FIG. 6. It is possible by the arrangement to reduce a length (in the X axis direction) of the energy harvester 1 than in a case where the diode 30 and the connection part 24A are disposed on the same XY plane along the X axis, for example. Accordingly, the energy harvester 1 can be made compact in size in the first embodiment.

Further, in the first embodiment, in a case where the opening portions 19A, 19B are provided by laser, the opening portions 19A, 19B may be provided in a site distanced from the power generation region 11 to some degree so that the power generation region 11 is prevented from being exposed to the ambient atmosphere. It is possible in this case to reduce a length (in the X axis direction) of the energy harvester 1 by positioning the diode 30 on the one surface side of the projection portion 14 and positioning the connection parts 24A, 24B on the other surface side of the projection portion 14 in the same manner as described above. Accordingly, it is possible in the first embodiment to make the energy harvester 1 compact in size, while preventing the power generation region 11 from being exposed to the ambient atmosphere.

Yet further, the diode 30 and the connection part 24A may be disposed on the same plane orthogonal to the flat plate-like energy harvester 1, as shown in FIG. 5, in the energy harvester 1 according to the first embodiment. It is possible by the arrangement to reduce a width (in the Y axis direction) of the energy harvester 1. That is, the energy harvester 1 can be further made compact in size by the arrangement.

Modified Example 1 of the First Embodiment

Figure 8:
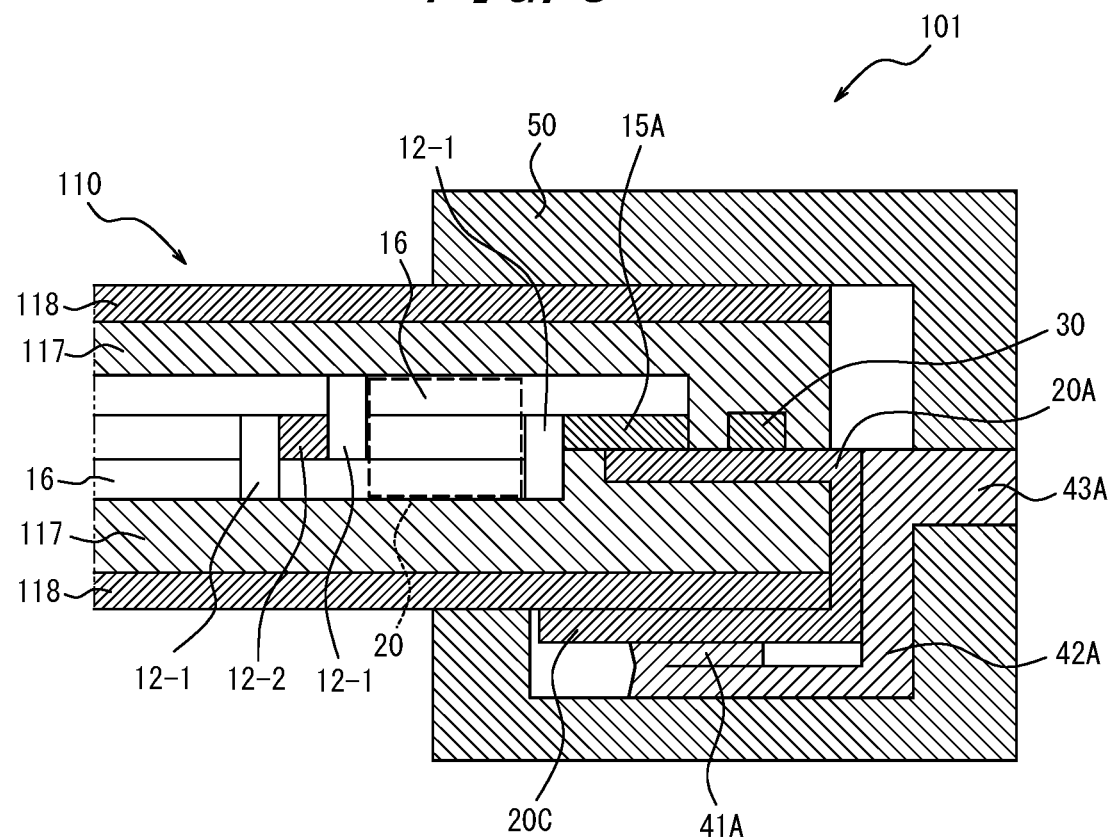
FIG. 8 is a drawing showing a modified example of the energy harvester of FIG. 4.

FIG. 8 is a drawing showing a modified example of the energy harvester 1 shown in FIG. 4. An energy harvester 101 according to the modified example has an energy harvesting part 110 in place of the energy harvesting part 10 shown in FIG. 4.

The energy harvesting part 110 has a sealing member 117 and a casing member 118. Unlike the structure shown in FIG. 4, the sealing member 117 and the casing member 118 cover the flexible wiring substrate 20A and the diode 30. In other words, a portion of the flexible wiring substrate 20A is positioned or incorporated inside the energy harvesting part 110. Similarly, a portion of the flexible wiring substrate 20B shown in FIG. 7 is positioned or incorporated inside the energy harvesting part 110. It is possible to more firmly fix the flexible wiring substrate 20A, 20B in the energy harvesting part 110 by the aforementioned arrangement than otherwise.

Moreover, a height of the internal wiring 15A and a height of the diode 30 in the Z axis direction can be made substantially equal to each other in the energy harvesting part 110 according to the modified example. In other words, the internal wiring 15A and a height of the diode 30 can be positioned on substantially the same plane. It is possible by the arrangement to unnecessitate connection of the internal wiring 15A and the diode 30 via a connecting member like a through hole and thus reduce the production cost.

In the present disclosure, both the diode 30 and the internal wiring 15A can be disposed on one surface of the two surfaces included by the flexible wiring substrate 20A, as shown in FIG. 8. Alternatively, it is possible in the present disclosure to dispose: the diode 30 on one surface of the two surfaces included by the flexible wiring substrate 20A; and the internal wiring 15A on the other surface of the two surfaces included by the flexible wiring substrate 20A, as described above and shown in FIG. 5.

The flexible wiring substrate 20C is disposed on a plane positioned on the negative direction side along the Z axis, of the energy harvesting part 110, in the present disclosure. However, it is acceptable to dispose the flexible wiring substrate 20C on a plane positioned on the positive direction side along the Z axis, of the energy harvesting part 110.

Effects and structures of the energy harvester 101 other than described above are the same as those of the energy harvester 1.

Modified Example 2 of the First Embodiment

Figure 9:
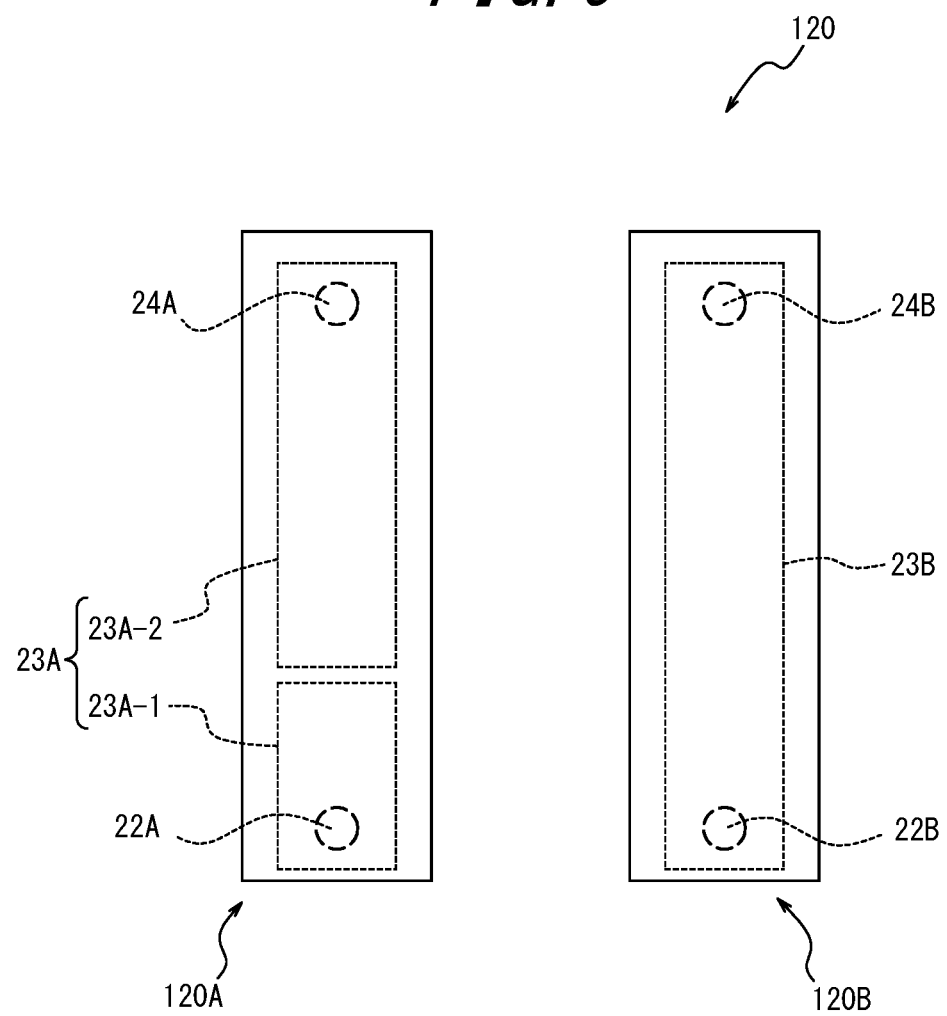
FIG. 9 is a drawing showing a modified example of the flexible wiring substrate of FIG. 7.

FIG. 9 is a drawing showing a modified example of the flexible wiring substrate 20 shown in FIG. 7. A flexible wiring substrate 120 according to the modified example includes a flexible wiring substrate 120A and a flexible wiring substrate 120B, which are independent of each other.

The flexible wiring substrate 120A can be provided at the opening portion 19A shown in FIG. 6 in the same manner as the flexible wiring substrate 20A shown in FIG. 7. Further, the flexible wiring substrate 120B can be provided at the opening portion 19B shown in FIG. 6 in the same manner as the flexible wiring substrate 20B shown in FIG. 7.

The flexible wiring substrate 120A can be bent along an outer surface of the projection portion 14 in the same manner as the flexible wiring substrates 20A, 20C shown in FIG. 6. Further, the flexible wiring substrate 120B can be bent along an outer surface of the projection portion 14 in the same manner as the flexible wiring substrates 20B, 20C shown in FIG. 6.

The flexible wiring substrate 120 may be employed in the energy harvester 101 shown in FIG. 8. A portion of the flexible wiring substrate 120A and a portion of the flexible wiring substrate 120B are disposed inside the energy harvester 110 shown in FIG. 8 in this case.

Modified Example 3 of the First Embodiment

Figure 10:
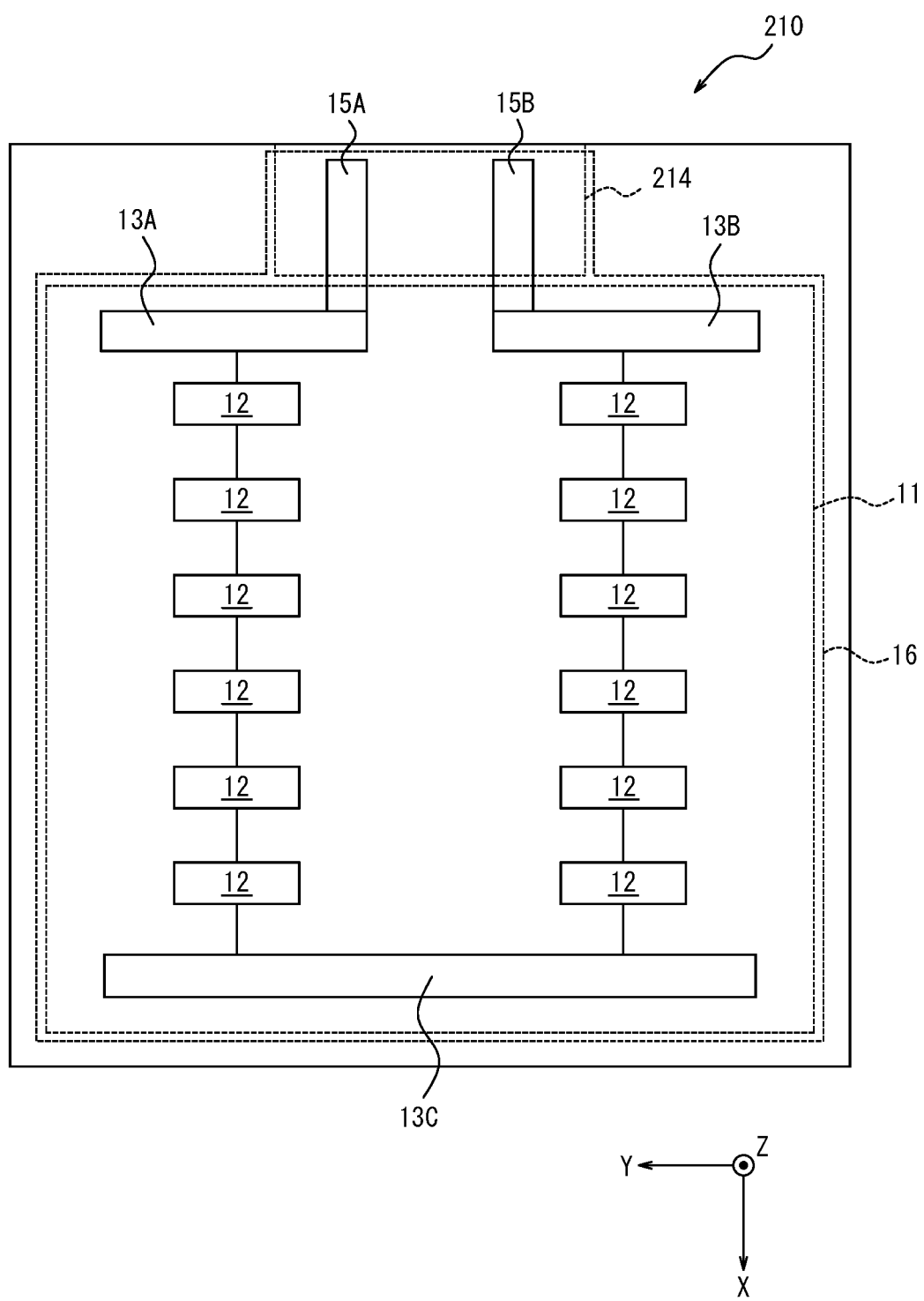
FIG. 10 is a drawing showing a modified example of the energy harvester of FIG. 2.

FIG. 10 is a drawing showing a modified example of the energy harvesting part 10 shown in FIG. 2. An energy harvesting part 210 according to the modified example has a substantially rectangular configuration. In other words, the energy harvesting part 210 according to the modified example is different from the energy harvesting part 10 shown in FIG. 2, in that the former does not have the projection 14.

A "side edge portion of the energy harvesting part" represents a portion defined between a side located on the most negative direction-side along the X axis, of the energy harvesting part, and a position distanced therefrom by a predetermined distance in the positive direction along the X axis in the present disclosure, as described above. A region 214 includes the side edge portion of the energy harvesting part 210 according to the aforementioned modified example of the first embodiment.

The internal wiring 15A extends from the power generation region 11 to the side edge portion included in the region 214 on the positive direction side of the Y axis. The internal wiring 15B extends from the power generation region 11 to the side edge portion included in the region 214 on the negative direction side of the Y axis.

The opening portion A and the opening portion 19B may be formed in the region 214, respectively, in the same manner as in the projection portion 14 shown in FIG. 6. The flexible wiring substrate 20A shown in FIG. 6 may be provided at the opening portion 19A formed in the region 214. The flexible wiring substrate 20B shown in FIG. 6 may be provided at the opening portion 19B formed in the region 214.

The region 214 may be clamped by the housing 50 shown in FIG. 4 in the same manner as the projection portion 14 shown in FIG. 4.

Structures and effects of the energy harvesting part 210 of the modified example, other than described above, are the same as those of the energy harvesting part 10 shown in FIG. 2.

Second Embodiment

Figure 11:
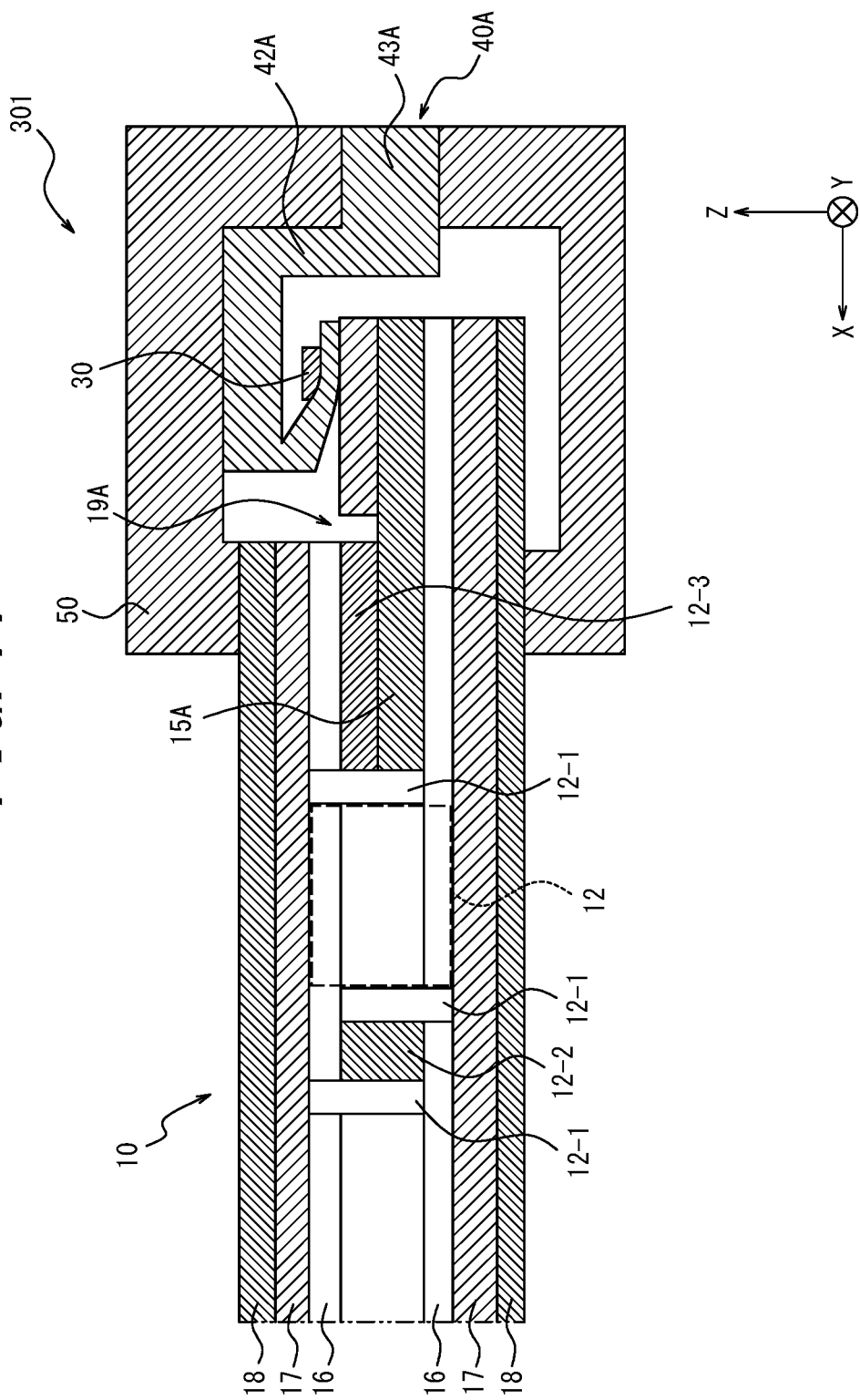
FIG. 11 is a drawing showing a schematic structure of an energy harvester according to a second embodiment of the present disclosure.

FIG. 11 is a drawing showing a schematic structure of an energy harvester 301 according to a second embodiment of the present disclosure.

Figure 12:
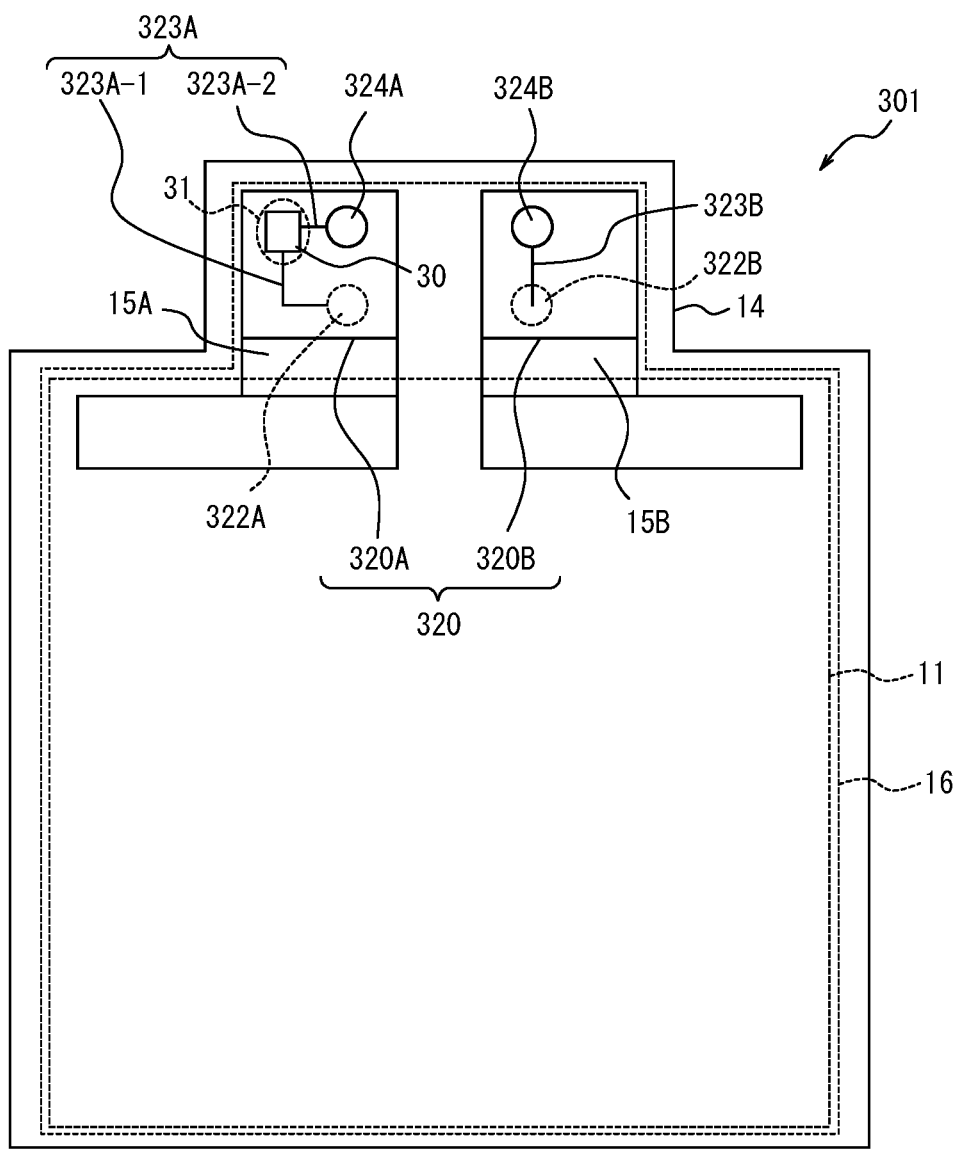
FIG. 12 is a view of the structure shown in FIG. 11, from the positive direction side of the Z axis, in a state where a housing has been removed.
Figure 13:
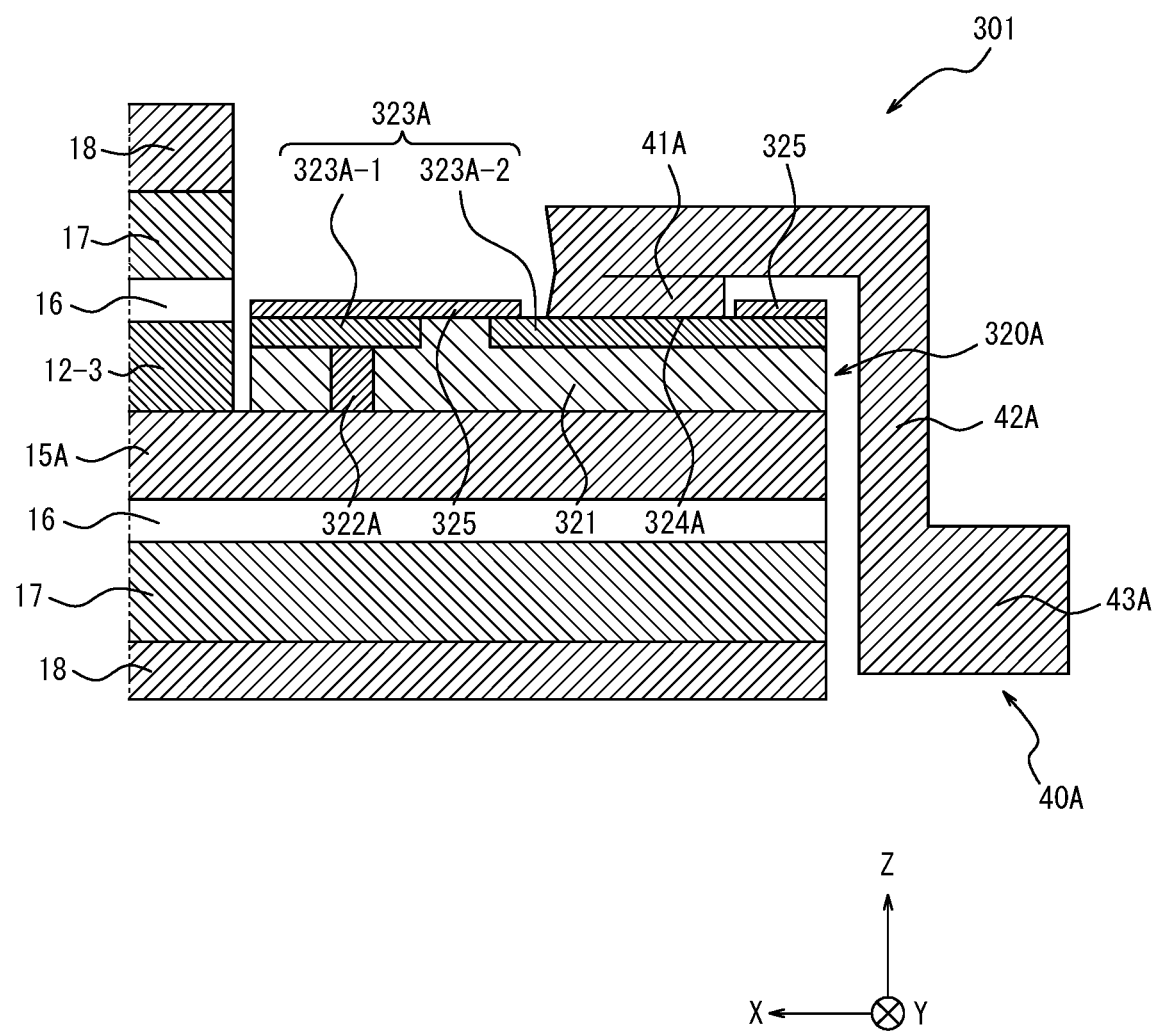
FIG. 13 is an enlarged view of the structure shown in FIG. 11 in a state where a housing has been removed.

FIG. 12 is a view of the structure shown in FIG. 11 from the positive direction side of the Z axis in a state where the housing 50 has been removed. FIG. 13 is an enlarged view of the structure shown in FIG. 11 in a state where the housing 50 has been removed.

The energy harvester 301 according to the second embodiment has the energy harvesting part 10, the diode 30, a pair of the connector parts 40A, 40B, and the housing 50 in the same manner as the first embodiment. The energy harvester 301 according to the second embodiment may have the sealing material 31 for coating peripheries of the diode 30 in the same manner as the first embodiment, as shown in FIG. 12. Further, the energy harvester 301 according to the second embodiment has a flexible wiring substrate 320, as shown in FIG. 12.

The flexible wiring substrate 320 shown in FIG. 12 includes a flexible wiring substrate 320A and a flexible wiring substrate 320B. The flexible wiring substrate 320A and the flexible wiring substrate 320B shown in FIG. 12 are independent of each other but structures of the flexible wiring substrates 320A, 320B are not restricted thereto. For example, a portion of the flexible wiring substrate 320A may be coupled with a portion of the flexible wiring substrate 320B.

The flexible wiring substrates 320A, 320B are provided on one surface of the projection portion 14. For example, as shown in FIG. 12, the flexible wiring substrates 320A, 320B are disposed on one (surface) plane positioned on the positive direction side along the Z axis, of the two (surface) planes included in the projection portion 14 and substantially in parallel to the XY plane. The flexible wiring substrate 320A is disposed in a portion on the positive direction side, along the Y axis, of the projection portion 14. The flexible wiring substrate 320B is disposed in a portion on the negative direction side, along the Y axis, of the projection portion 14.

As shown in FIG. 11, the flexible wiring substrate 320A may be provided in the opening portion 19A. Specifically, the flexible wiring substrate 320A may be provided on the internal wiring 15A exposed from the opening portion 19A. Similarly, a portion of the flexible wiring substrate 320B may be provided in the opening portion 19B shown in FIG. 6. Specifically, the flexible wiring substrate 320B may be provided on the internal wiring 15B exposed from the opening portion 19B.

The flexible wiring substrate 320A has an insulating layer 321, a connecting member 322A, a wiring layer 323A, a connection part 324A, and a protection layer 325, as shown in FIG. 13. The flexible wiring substrate 320B has an insulating layer 321 and a protection layer 325 in the same manner as the flexible wiring substrate 320A. Further, the flexible wiring substrate 320B has a connecting member 322B, a wiring layer 323B, and a connection part 324B, as shown in FIG. 12.

The insulating layer 321 shown in FIG. 13 may be directly provided on an outer surface of the projection portion 14 shown in FIG. 12. The insulating layer 321 may be formed of a material similar to the material of the insulating layer 21 shown in FIG. 5.

The connecting member 322A shown in FIG. 13 electrically connects the internal wiring 15A and the wiring layer 323A (wiring layer 323A-1), as shown in FIG. 12. The connecting member 322B electrically connects the internal wiring 15B and the wiring layer 323B.

The connecting member 322A may be formed by providing a through hole in the insulating layer 321 of the flexible wiring substrate 320A and filling the through hole by a conductive member such as a conductive adhesive. The connecting member 322B may be formed by providing a through hole in the insulating layer 321 of the flexible wiring substrate 320B and filling the through hole by a conductive member such as a conductive adhesive.

The wiring layers 323A, 323B shown in FIG. 13 may be formed by metal foil having thickness not exceeding 300 μm in the same manner as the wiring layer 23A shown in FIG. 5.

One end portion of the wiring layer 323A is electrically connected to the internal wiring 15A by way of the connecting member 322A, as shown in FIG. 12 and FIG. 13. The other end portion of the wiring layer 323A is electrically connected to the spring 41A of the connector part 40A by way of the connection part 324A. For example, as shown in FIG. 12 and FIG. 13, the wiring layer 323A may include a wiring layer 323A-1 as one end portion of the wiring layer 323A and a wiring layer 323A-2 as the other end portion of the wiring layer 323A.

One end portion of the wiring layer 323B shown in FIG. 12 is electrically connected to the internal wiring 15B by way of the connecting member 322B in a manner similar to the wiring layer 323A. The other end portion of the wiring layer 323B is electrically connected to the spring 41B of the connector part 40B shown in FIG. 3 by way of the connection part 324B.

The wiring layer 323A is electrically connected to the diode 30, as shown in FIG. 12 and FIG. 13. For example, the wiring layer 323A-1 is electrically connected to the anode of the diode 30. The wiring layer 323A-2 is electrically connected to the cathode of the diode 30.

The connection part 324A shown in FIG. 13 may be a portion of the wiring layer 323A-2 as the other end of the wiring layer 323A in the same manner as the connection part 24A shown in FIG. 5. Similarly, the connection part 324B shown in FIG. 12 may be a portion of the other end of the wiring layer 323B.

The connection part 324A shown in FIG. 12 electrically connects the cathode of the diode 30 to the spring 41A of the connector part 40A in the same manner as the connection part 24A shown in FIG. 5. The connection part 324B shown in FIG. 12 electrically connects the internal wiring 15B to the spring 41B of the connector part 40B shown in FIG. 3 by way of the wiring layer 323B.

In the second embodiment, the connection parts 324A, 324B are positioned on the side of the same one surface of the projection portion 14, for example, on the side of an outer surface disposed on the positive direction side along the Z axis of the projection portion 14, respectively, as shown in FIG. 12. The connection parts 324A, 324B may have any appropriate configurations.

Further, in the second embodiment, the connection parts 324A, 324B are positioned between the diode 30 and the power generation region 11 in the attaching/detaching direction shown in FIG. 1, i.e. the X axis direction. In this case, the connection parts 324A, 324B and the diode 30 may be juxtaposed with each other to be substantially in parallel to a side edge located on the negative direction side along the X axis of the projection portion 14, as shown in FIG. 12. Alternatively, the connection parts 324A, 324B may be positioned further on the power generation region 11 side in the X axis direction than the diode 30.

The protection layer 325 shown in FIG. 13 is formed as an upper layer of the flexible wiring substrate 320. The protection layer 325 may be formed by solder resist.

It is possible to increase a degree of freedom in deciding locations where the diode 30 and the connection parts 324A, 324B are to be provided by disposing the diode 30 and the connection parts 324A, 324B in the flexible wiring substrate 320 in the present disclosure, as described above. Accordingly, it is possible in the present disclosure to make the energy harvester 301 compact in size by thus increasing a degree of freedom in positioning the diode 30 and the connection parts 324A, 324B.

In respect of the locations where the diode 30 and the connection parts 324A, 324B are to be provided described above, the diode 30 and the connection parts 324A, 324B are positioned on the same surface side of the projection portion 14, for example, on the side of an outer surface disposed on the positive direction side along the Z axis of the projection portion 14, respectively, as shown in FIG. 12, in the energy harvester 301 according to the second embodiment. Further, in the second embodiment, the connection parts 324A, 324B are positioned between the diode 30 and the power generation region 11 in the attaching/detaching direction or the X axis direction. It is possible by such an arrangement as described above to decrease a length (in the X axis direction) of the energy harvester 301 than, for example, a case where the diode 30 and the connection part 324A are disposed along the X axis, thereby successfully making the energy harvester compact in size, in the second embodiment.

Further, the flexible wiring substrate 320 can be provided on one surface side of the projection portion 14, without being bent, in the energy harvester 301 according to the second embodiment. It is possible by the arrangement to omit a process of bending the flexible wiring substrate 320 in the energy harvester 301. Accordingly, the energy harvester 301 according to the second embodiment can be manufactured by the reduced number of processes than a case where the flexible wiring substrate 320 needs to be bent.

Yet further, the connection parts 324A, 324B and the diode 30 can be provided so as to be juxtaposed with each other substantially on the same line which is in parallel to the side edge located on the negative direction side along the X axis of the projection portion 14. It is possible by the arrangement to decrease a length of the wiring layer 323A-2 for electrically connecting the connection part 324A and the diode 30.

Effects and structures of the energy harvester 301 according to the second embodiment, other than described above, are the same as those of the energy harvester 1 according to the first embodiment.

It should be noted that the energy harvesting part 110 according to the modified example (refer to FIG. 8), instead of the energy harvesting part 10, may be employed in the energy harvester 301 according to the second embodiment. A portion of the flexible wiring substrate 320A and a portion of the flexible wiring substrate 320B shown in FIG. 12 are disposed inside the energy harvesting part 110 shown in FIG. 8 in this case.

It should also be noted that the energy harvesting part 210 according to the modified example (refer to FIG. 10) may be employed in the energy harvester 301 according to the second embodiment. The flexible wiring substrate 320A and the flexible wiring substrate 320B shown in FIG. 12 are disposed in the region 214 shown in FIG. 10 in this case.

The foregoing description represents merely one embodiment of the present disclosure and, needless to say, various changes/modifications may be made in the accompanying claims.

INDUSTRIAL APPLICABILITY

According to the present disclosure, it is possible to provide an energy harvester which is compact in size.

REFERENCE SIGNS LIST 1, 101, 301 Energy harvester
2 Female connector
2A Positive electrode terminal
2B Negative electrode terminal
10, 110, 210 Energy harvesting part
11 Power generation region
12 Solar cell
12-1 Partition
12-2 Cell-connecting portion
12-3 Filler member
13A, 13B, 13C Current-collecting electrode
14 Projection portion
15A, 15B Internal wiring
16 Electrode substrate
17, 117 Sealing member
18, 118 Casing member
19A, 19B Opening portion
20, 20A, 20B, 20C, 120, 120A, 120B, 320, 320A, 320B Flexible wiring substrate
21, 321 Insulating layer
22A, 22B, 322A, 322B Connecting member
23A, 23B, 23A-1, 23A-2, 323A, 323B, 323A-1, 323A-2 Wiring layer
24A, 24B, 324A, 324B Connection part
25, 325 Protection layer
30 Diode
31 Sealing material
40A, 40B Connector part
41A, 41B Spring
42A, 42B Main body portion
43A, 43B Terminal portion
50 Housing
214 Region

The invention claimed is:

1. An energy harvester, wherein it comprises:
a flat plate-like energy harvesting part having a power generation region which generates electric power by utilizing an energy in an external environment and an internal wiring to which the electric power thus generated is supplied;
a connector part connectable to an external device;
a diode having an anode, the anode being electrically connected with the internal wiring; and
a flexible wiring substrate, the flexible wiring substrate including an insulating layer and a wiring layer, on which the diode and a connection part for electrically connecting a cathode of the diode to the connector part are provided,
wherein the internal wiring extends from the power generation region to a side edge portion of the energy harvesting part,
at least a portion of the flexible wiring substrate is provided in the side edge portion so as to overlap a portion of the internal wiring,
the energy harvesting part has an opening portion where the internal wiring is exposed, and the flexible wiring substrate is provided in the opening portion,
the insulating layer of the flexible wiring substrate is the only one insulating layer provided between the internal wiring and the diode, on a plane vertical to the flat plate-like energy harvesting part, in the side edge portion,
an electrode substrate, the internal wiring, the portion of the flexible wiring substrate, and the diode are laminated in this order, on the plane, in the side edge portion, and
the anode of the diode is electrically connected with the internal wiring by way of a connecting member provided in a hole formed in the insulating layer.

2. The energy harvester of claim 1, wherein peripheries of the diode are coated with a sealing material formed of a cured resin composition for sealing, the resin composition for sealing includes a photocurable resin composition, a thermosetting resin composition, or a thermoplastic resin composition.

3. The energy harvester of claim 2, wherein a conductive member exposed from the flexible wiring substrate in the vicinity of the diode is coated with the sealing material.

4. The energy harvester of claim 1, further comprising a housing for accommodating the diode and the connection part and clamping the side edge portion of the energy harvesting part.

5. The energy harvester of claim 1, wherein the flexible wiring substrate is bent to extend from one surface of the side edge portion to the other surface thereof, the diode is located on the one surface side of the side edge portion, and the connection part is located on the other surface side of the side edge portion.

6. The energy harvester of claim 1, wherein the flexible wiring substrate is disposed on a surface of the side edge portion,
 the diode and the connection part are located on the surface side of the side edge portion, and
 the connection part is positioned between the diode and the power generation region in a direction in which the connector part is attached to/detached from the exterior device.

7. The energy harvester of claim 1, wherein the flexible wiring substrate is disposed on a surface of the side edge portion, the diode and the connection part are located on the surface side of the side edge portion, and
 the diode and the connection part are juxtaposed with each other to be substantially in parallel to a side edge of the energy harvesting part.

8. The energy harvester of claim 1, wherein a projecting portion projecting from the power generation region includes the side edge portion of the energy harvesting part.

9. The energy harvester of claim 8, wherein the diode and the connection part are located in the projecting portion.

10. The energy harvester of claim 1, wherein the flexible wiring substrate is adhered to the internal wiring without clearance therebetween in an entire area of the side edge portion.

* * * * *